(12) United States Patent
Kastner et al.

(10) Patent No.: US 11,579,261 B2
(45) Date of Patent: Feb. 14, 2023

(54) TRANSMITTER UNIT FOR EMITTING RADIATION INTO A SURROUNDING AREA

(71) Applicant: Robert Bosch GmbH, Stuttgart (DE)

(72) Inventors: Martin Kastner, Markgroeningen (DE); Hans-Jochen Schwarz, Stuttgart (DE); Stefan Spiessberger, Weinstadt (DE)

(73) Assignee: Robert Bosch GmbH, Stuttgart (DE)

( * ) Notice: Subject to any disclaimer, the term of this patent is extended or adjusted under 35 U.S.C. 154(b) by 609 days.

(21) Appl. No.: 16/615,479

(22) PCT Filed: May 9, 2018

(86) PCT No.: PCT/EP2018/061976
§ 371 (c)(1),
(2) Date: Nov. 21, 2019

(87) PCT Pub. No.: WO2018/215211
PCT Pub. Date: Nov. 29, 2018

(65) Prior Publication Data
US 2020/0116826 A1 Apr. 16, 2020

(30) Foreign Application Priority Data

May 23, 2017 (DE) ..................... 10 2017 208 705.6

(51) Int. Cl.
*H01S 5/40* (2006.01)
*G01S 7/484* (2006.01)
(Continued)

(52) U.S. Cl.
CPC ............ *G01S 7/484* (2013.01); *G01S 7/4815* (2013.01); *G01S 17/10* (2013.01); *H01S 5/0071* (2013.01); *H01S 5/0428* (2013.01); *H01S 5/4031* (2013.01)

(58) Field of Classification Search
CPC .... H01S 5/0428; H01S 5/4031; H01S 5/0615; H01S 5/06253; H01S 5/06835;
(Continued)

(56) References Cited

U.S. PATENT DOCUMENTS

| 7,428,342 B2 | 9/2008 | Tu et al. |
| 2007/0092177 A1 | 4/2007 | Nilsson et al. |
| 2010/0128109 A1 | 5/2010 | Banks |

FOREIGN PATENT DOCUMENTS

| DE | 102007004609 A1 | 8/2007 |
| DE | 102008056096 A1 | 5/2010 |

(Continued)

OTHER PUBLICATIONS

International Search Report for PCT/EP2018/061976 dated Jul. 18, 2018.

(Continued)

*Primary Examiner* — Xinning(Tom) Niu
*Assistant Examiner* — Delma R Fordé
(74) *Attorney, Agent, or Firm* — Norton Rose Fulbright US LLP; Gerard Messina

(57) ABSTRACT

A transmitter unit for emitting radiation into the surrounding area, including at least one semiconductor laser, which has at least one first emitter possessing a first section and a second section; and at least one control unit for controlling the semiconductor laser. The control unit is configured to apply a first supply variable to the first section of the at least one emitter, and to apply a second supply variable differing from the first supply variable, to the second section of the at least one emitter.

8 Claims, 3 Drawing Sheets

(51) Int. Cl.
*G01S 7/481* (2006.01)
*G01S 17/10* (2020.01)
*H01S 5/00* (2006.01)
*H01S 5/042* (2006.01)

(58) Field of Classification Search
CPC ........ G01S 7/484; G01S 7/4815; G01S 7/497; G01S 17/10; G01S 17/42; G01S 7/4911
See application file for complete search history.

(56) References Cited

FOREIGN PATENT DOCUMENTS

| EP | 0665446 | A2 | 8/1995 |
|----|---------|----|--------|
| GB | 2283858 | A | 5/1995 |
| JP | H0690058 | A | 3/1994 |
| JP | H07193621 | A | 7/1995 |
| JP | 2002094463 | A | 3/2002 |
| JP | 2004198697 | A | 7/2004 |
| JP | 2010151958 | A | 7/2010 |

OTHER PUBLICATIONS

Vasil'Ev, P.P., "Ultrashort Pulse Generation in Diode Lasers", Opticaland Quantum Electronics, 1992, vol. 24, pp. 801-824.

Vasil'Ev, P.P., et al., "Narrow Line High Power Picosecond Pulse Generation in a Multicontact Distributed Feedback Laser Using Modified Q Switching", Electron. Lett., 1993, vol. 29, No. 6, pp. 561-563.

Zhu, B. et al., "High-Peak-Power Picosecond Optical Pulse Generation From Q-Switched Bow-Tie Laser With a Tapered Traveling Wave Amplifier", IEEE Phot. Tech. Lett., 1996, vol. 8, No. 4, pp. 503-505.

Portnoi, E. L. et al., "Superhigh-Power Picosecond Optical Pulses From A-Switched Diode Laser", IEEE Journal of Selected Topics in Quantum ELECTRONICS,1997, vol. 3, No. 2, pp. 256-260.

TRANSMITTER UNIT FOR EMITTING RADIATION INTO A SURROUNDING AREA

FIELD

The present invention relates to a transmitter unit for emitting radiation into a surrounding area and a method for controlling a transmitter unit.

BACKGROUND INFORMATION

The publication PORTNOI, E. L. et al., Superhigh-Power Picosecond Optical Pulses from Q-Switched Diode Laser, IEEE Journal of Selected Topics in Quantum Electronics, April, 1997, Vol. 3, No. 2, pp. 256-260, describes a semiconductor laser, which is operated, using passive Q-switching.

A lidar system, in which a solid-state laser is operated, using passive Q-switching, is described in U.S. Pat. No. 7,428,342.

SUMMARY

The present invention starts out from a transmitter unit for emitting radiation into a surrounding area, the transmitter unit including at least one semiconductor laser, which has at least one first emitter possessing a first section and a second section; and including at least one control unit for controlling the semiconductor laser.

According to the present invention, the control unit is configured to apply a first supply variable to the first section of the at least one emitter, and to apply a second supply variable differing from the first supply variable, to the second section of the at least one emitter.

A supply variable may be an electric charge. A supply variable may be, for example, a current or a voltage. The first section may be called an amplifier section. For example, charge carriers may be stored here. The second section may be called a switching section. The second section may be switched rapidly. The radiation may be laser radiation. The laser radiation may be pulsed.

The first and the second supply variable may differ from each other, for example, in their magnitudes. The time of application of the first supply variable to the first section may differ from the time of application of the second supply variable to the second section. For this, the contacting of the first section may differ from the contacting of the second section.

An advantage of the present invention is that the semiconductor laser may be controlled selectively, using active Q-switching, that is, using at least one second supply variable. Thus, the time of emission of laser radiation by the semiconductor laser may be controlled highly precisely. The transmitter unit may emit (transmit) short laser pulses having high energy and high power. In comparison with, for example, the use of solid-state lasers, high pulse repetition rates, in particular, in the range of 100 kHz to 1 MHz, may be attained with the aid of the semiconductor laser. The semiconductor laser provides the advantage of smaller size and lower cost. In comparison with transmitter units having lasers, which are not Q-switched, higher pulse powers may be rendered possible at the same pulse energy. This is advantageous with regard to the ocular safety of the transmitter unit and the detection range of the receiving unit (improved signal-to-noise ratio).

In one advantageous refinement of the present invention, it is provided that the first section include a first region having at least one semiconductive material. The second section includes a second region having at least one semiconductive material. The first region and the second region are set apart from each other.

The first and the second region may be made of different materials. The first and the second region may be patterned differently. Due to the spacing of the first and the second region, a third region may be formed between the first and the second region. This third region may be, e.g., an insulating region, which means that no electric charge may be transmitted directly from the first to the second region, or vice versa. Therefore, the first and the second region may at least be electrically isolated in the contacting plane.

An advantage is that contacting of the first and the second section of the semiconductor laser is rendered possible on the semiconductive materials. Due to the spacing of the first and the second region, the application of the first supply variable to the first section and the application of the second supply variable to the second section may take place in a selected and highly precise manner. Thus, for example, an exchange of charge carriers between the first and the second region may be prevented. Due to this, electric charge may be applied selectively to the amplifier section. The second section may be switched selectively and rapidly.

In one specific embodiment of the present invention, the semiconductor laser may have exactly one emitter. An advantage is that the transmitter unit may emit laser radiation in the form of a point-shaped laser beam having high energy and high power.

In one further advantageous refinement of the present invention, the semiconductor laser has at least two emitters. Each of the at least two emitters has, in each instance, a first section assigned to the emitter and a second section assigned to the emitter.

The advantage is that when the at least two emitters are positioned side-by-side, the transmitter unit may emit the laser radiation in the form of a linear laser beam having high energy and high power. Further geometries of the laser beam are possible as a function of the positioning of the at least two emitters.

In one further advantageous refinement of the present invention, the control unit is configured to apply, in each instance, a second supply variable associated with the respective emitter to the second section of each of the at least two emitters; the second supply variables being, in particular, different.

An advantage is that each of the at least two emitters may be switched individually.

In one further advantageous refinement of the present invention, temporally correlated emission of the radiation may be generated by applying a second supply variable associated with the respective emitter to the respective, second section of each of the at least two emitters.

An advantage is that even higher pulse powers and even lower pulse widths may be produced.

In a further advantageous refinement of the present invention, the transmitter unit also includes a detector for detecting at least one reference beam. The second supply variable associated with the specific emitter is a function of the at least one reference beam.

An advantage is that in this manner, an analysis of the laser radiation emitted by each of the at least two emitters is possible. Assuming that, the second supply variable assigned to the specific emitter may be adapted. This adaptation may be such, e.g., that the emission of the radiation may be temporally correlated even more effectively.

In one further advantageous refinement of the present invention, the transmitter unit includes further optical elements. The transmitter unit includes, in particular, a deflection unit for deflecting the radiation emitted by the semiconductor laser, along a deflecting direction, into the surrounding area. The deflection unit may be movable, and its movement may be controllable. The deflection unit may be, e.g., a mirror.

An advantage is that the shape and propagation direction of the radiation emitted by the semiconductor laser may be changed. Thus, the propagation direction may be changed by optical elements, such as a mirror or beam splitter. The shape of the radiation may be changed, e.g., by optical lenses or prisms. By controlling the movable deflection unit, the transmitter unit may become usable for systems, in which the laser radiation must be deflectable into different spatial directions.

The present invention also starts out from a lidar sensor having a transmitter unit as described above. The lidar sensor further includes a receiving unit for receiving radiation, which has been reflected by an object in the surrounding area. The receiving unit may include a detector for detecting the received radiation. The detector may be, in particular, a single photon avalanche photodiode detector (single photon avalanche diode, SPAD).

An advantage is that an improved signal-to-noise ratio for the lidar sensor is produced by the active Q-switching of the semiconductor laser. In this connection, the effective signal-to-noise ratio may be due to the short laser pulses of the transmitter unit, having high energy and high power. The system resolution for the lidar sensor may be increased. The range of the lidar sensor described here may be significantly greater than in the case of lidar sensors, whose transmitter unit does not include a semiconductor laser have active Q-switching.

The present invention also starts out from a method to control a transmitter unit for emitting radiation into the surrounding area; the transmitter unit including at least one semiconductor laser, which has at least one first emitter possessing a first section and a second section. The method includes the step of applying a first supply variable to the first section with the aid of a control unit. The method further includes the step of applying a second supply variable differing from the first supply variable, to the second section, with the aid of the control unit.

In one advantageous refinement of the present invention, the semiconductor laser has at least two emitters. Each of the at least two emitters has, in each instance, a first section assigned to the emitter and a second section assigned to the emitter. In each instance, a second supply variable assigned to the respective emitter is applied to the second section of each of the at least two emitters. The second supply variables are, in particular, different.

In a further advantageous refinement of the present invention, the method includes the additional step of detecting at least one reference beam with the aid of a detector. In a further step, the at least one reference beam is analyzed. In a further step, the second supply variable assigned to the respective emitter is adapted as a function of the analysis.

BRIEF DESCRIPTION OF THE DRAWINGS

An exemplary embodiment of the present invention is explained below in more detail, with reference to the Figures. In the figures, the same reference symbols denote identical or functionally equivalent elements.

DETAILED DESCRIPTION OF EXAMPLE EMBODIMENTS

Figure 1:
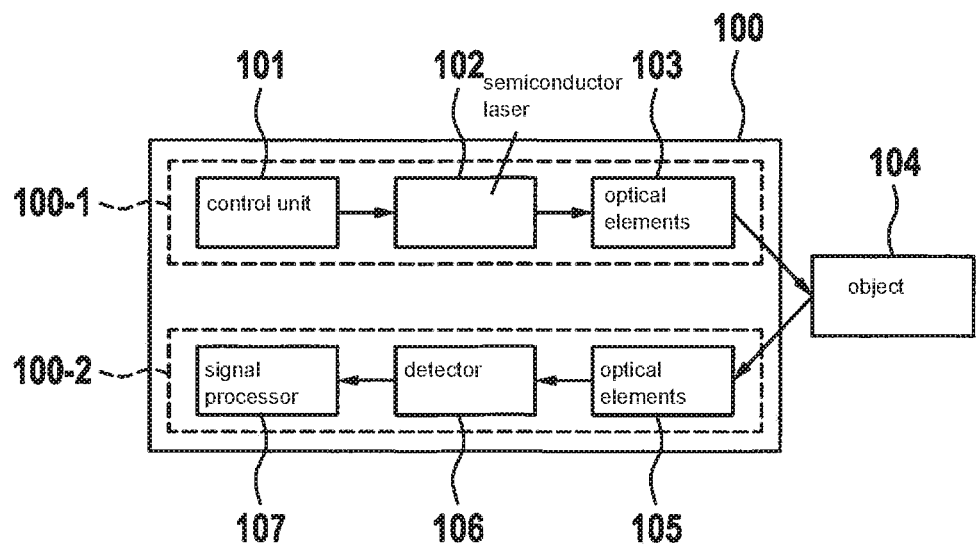
FIG. 1 shows a lidar sensor having a transmitter unit according to the present invention.

FIG. 1 illustratively shows the schematic layout of a lidar sensor 100. Lidar sensor 100 includes transmitter unit 100-1.

This, in turn, includes control unit 101. Semiconductor laser 102 is controlled and, therefore, operated with the aid of control unit 101. Semiconductor laser 102 emits radiation in the form of laser radiation. The laser radiation may be pulsed. The shape and propagation direction of the laser radiation may be changed with the aid of at least one further optical element 103. In this connection, optical element 103 is only represented schematically. For example, optical element 103 may be a mirror, a beam splitter, a lens or a prism.

The laser radiation may be emitted (transmitted) into the surrounding area. After being altered by optical element 103, the laser radiation may be emitted (transmitted) into the surrounding area. In the surrounding area, the laser radiation may be reflected by an object 104. In the surrounding area, the laser beam may be scattered by an object 104. The radiation reflected and/or scattered by object 104 may be received by receiving unit 100-2 of lidar sensor 100. Receiving unit 100-2 may also have optical elements 105 for this. The received radiation may be guided to a detector 106. Through this, signals are generated at the detector. These signals may be evaluated with the aid of a device for processing signals 107.

Figure 2:
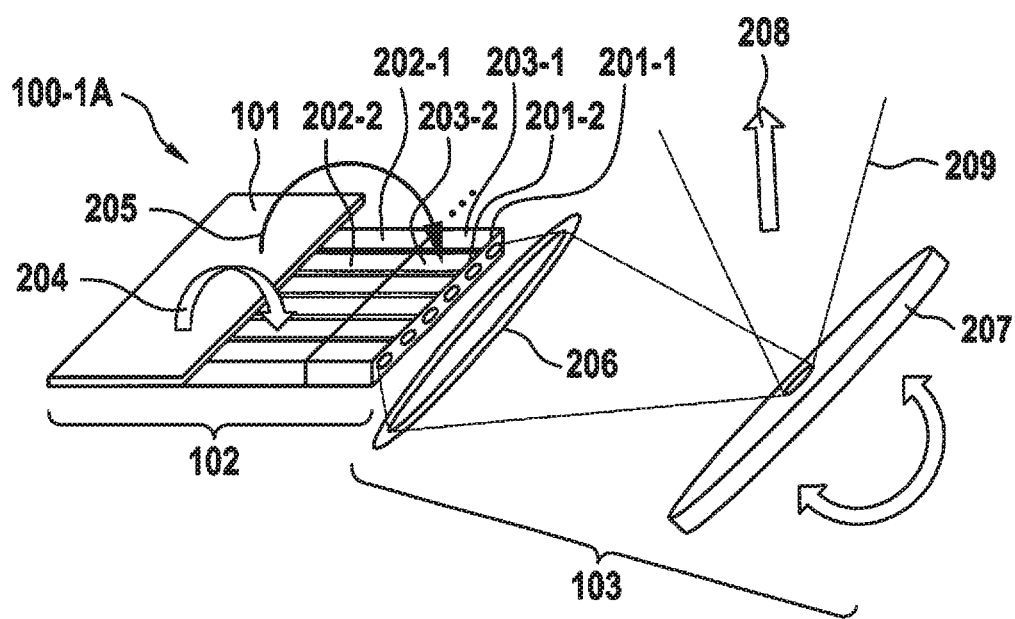
FIG. 2 shows a first exemplary embodiment of a transmitter unit.

FIG. 2 shows transmitter unit 100-1A as a first exemplary embodiment. The semiconductor laser 102 shown includes the six emitters 201-1 through 201-6 (referred to as 201-x in the following). For the sake of clarity, only emitters 201-1 and 201-2, as well as further features associated with these two emitters 201-1 and 201-2, are labeled. Each of emitters 201-x of semiconductor laser 102 includes a first section 202-x and a second section 203-x. First sections 202-x may be the amplifier sections. Second sections 203-x may be the switching sections.

Figure 5:
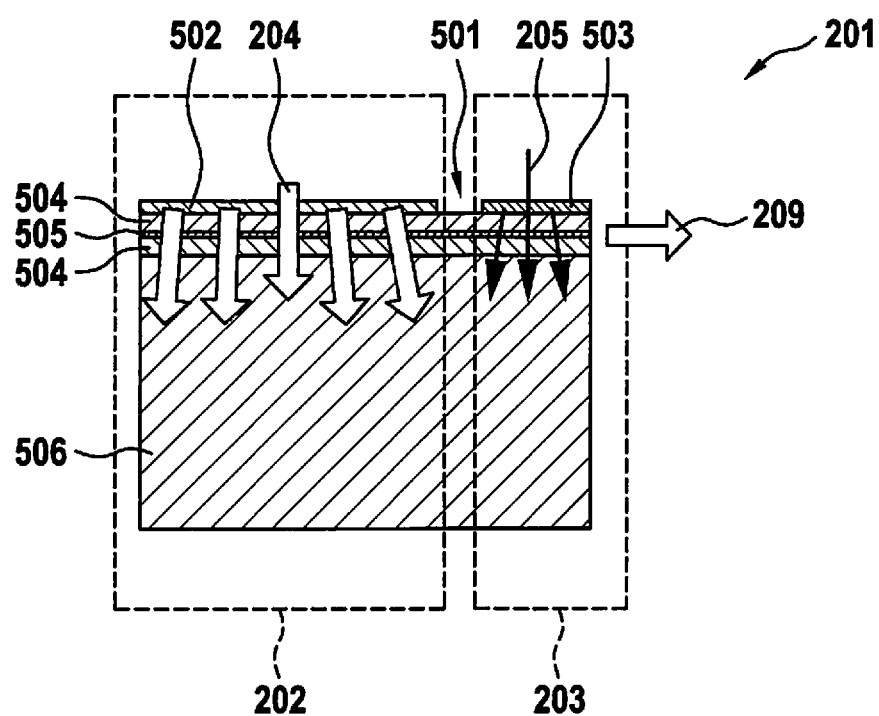
FIG. 5 shows a cross section of an emitter of the semiconductor laser.

An example of the exact layout of such an emitter 201-x is described further down in FIG. 5.

With the aid of control unit 101, a first supply variable 204 is applied to first sections 202-x of the six emitters 201-x shown. First supply variable 204 may be applied to each of first sections 202-x. For example, current 204 flows to amplifier sections 202-x. With the aid of control unit 101, a second supply variable 205 is applied to second sections 203-x of the six emitters 201-x shown. Second supply variable 205 may be applied to each of the second sections. For example, current 205 flows to switching sections 203-x. Control unit 201 is preferably configured to apply first supply variable 204 to first sections 202-x independently of the application of second supply variable 205 to second sections 203-x. For this, control unit 201 may be, e.g., a multisectional laser diode driver. Emitters 201-x may be activated by actively applying second supply variable 205 to second sections 203-*x*. In this manner, the individual pulses of the six emitters 201-*x* may be correlated temporally. The individual pulses of emitters 201-*x* may be synchronized. Through this, high pulse energies and high pulse powers may be obtained.

The location of first sections 202-*x* and second sections 203-*x* is variable. First sections 202-*x* and second sections 203-*x* may also be positioned in such a manner, that second sections 203-*x* are located closer to control unit 201. This has the advantage of a shorter electrical connection of control unit 201 to switching sections 203-*x*. This produces a lower inductance, which results in a more rapid switching operation at lower voltages. Switching sections 203-*x* may also be positioned centrally with respect to semiconductor laser 102. Switching sections 203-*x* may also be staggered variably. A plurality of switching sections 203-*x*-*y* (y=1 through z) per emitter 201-*x* may also be installed.

In the example shown, the pulsed laser beams of all emitters 201-*x* are concentrated by an optical lens 206 and focused onto a movable mirror 207. Laser radiation 209 is emitted along deflecting direction 208 into the surrounding area of transmitter unit 100-1A, in the form of a linear laser beam.

Figure 3:
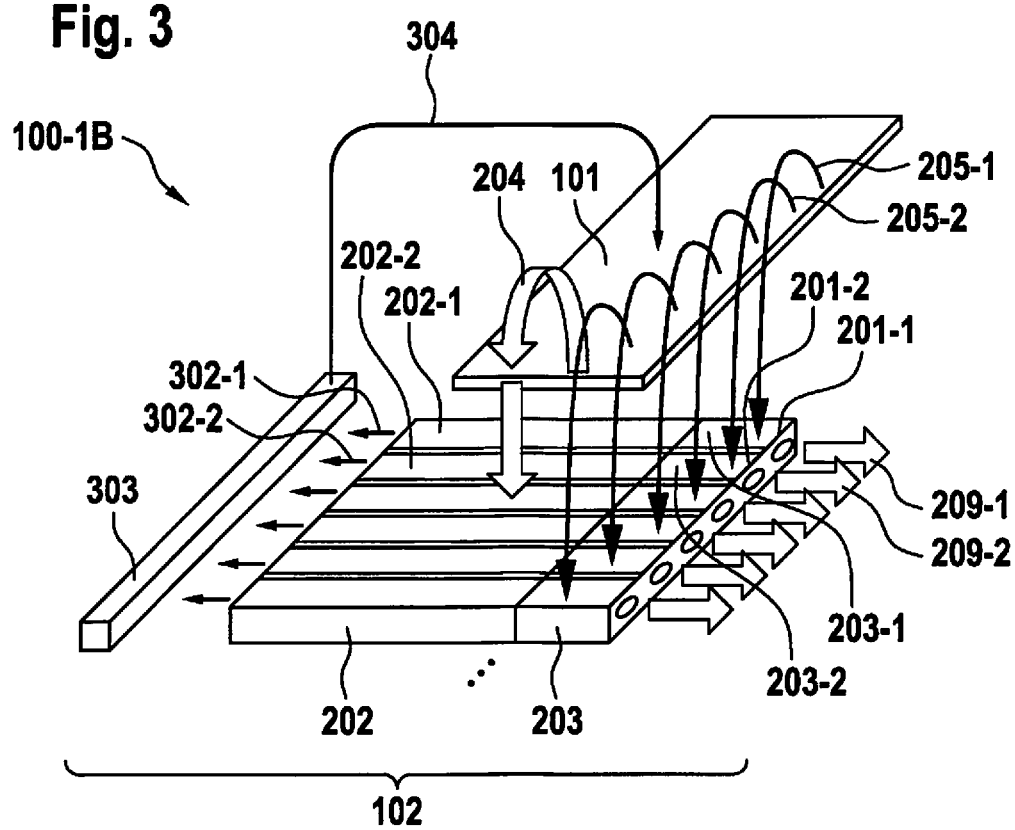
FIG. 3 shows a second exemplary embodiment of a transmitter unit.

FIG. 3 shows transmitter unit 100-1B as a second exemplary embodiment. Reference numerals, which are the same as in FIG. 1 or 2, denote identical or functionally equivalent elements. In a manner analogous to the exemplary embodiment from FIG. 2, transmitter unit 100-1B may also include further optical elements, such as an optical lens or a deflection mirror. In FIG. 3, these further optical elements are not shown separately.

The indicated semiconductor laser 102 of transmitter unit 100-1B includes six emitters 201-*x*. Each of emitters 201-*x* includes a first section 202-*x*, the amplifier section, and a second section 203-*x*, the switching section.

Transmitter unit 100-1B further includes detector 303 for detection of reference beam 302-*x* from the rear facet of emitters 201-*x*. Detector 303 may be, e.g., a monitoring diode array. The reference beam may be analyzed. In light of reference beam 302-*x*, the chronological sequence of laser pulses 209-*x* of emitters 201-*x* may be acquired. A signal 304, which represents the information item regarding the chronological sequence, may be transmitted to control unit 101.

With the aid of control unit 101, a first supply variable 204 may be applied to first sections 202-*x* of the six emitters 201-*x* shown. First supply variable 204 may be applied to each of first sections 202-*x*. In this connection, supply variable 204 may have the same magnitude for all of six emitters 201-*x*. Amplifier sections 202-*x* of all emitters 201-*x* are charged by a common current 204.

With the aid of control unit 101, a second supply variable 205-*x* associated with the specific emitter may be applied to second sections 203-*x* of the six emitters 201-*x* shown. For example, the current 205-1, which flows to switching section 203-1, may have a magnitude different from the current 205-2, which flows to switching section 203-2, etc. In particular, in light of the information item regarding the chronological sequence of laser pulses 209-*x* of emitters 201-*x*, second supply variables 205-*x* may be adapted in such a manner, that the emission of laser pulses 209-*x* is temporally correlated in an even more effective manner. The synchronism of emitted laser pulses 209-*x* is increased.

Figure 4A:
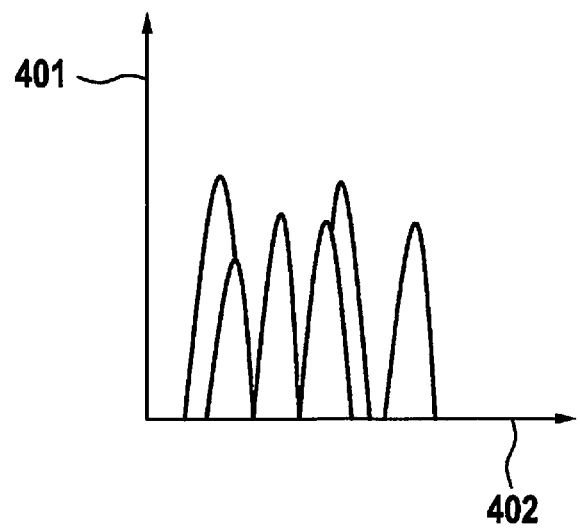
FIG. 4A shows the emitted laser radiation of a transmitter unit, without temporal correlation.

FIG. 4A shows a graph, in which optical power is plotted versus time 402. Individual pulses 209-*x* of emitters 201-*x* of a transmitter unit are represented qualitatively without temporal correlation/synchronization, as shown, e.g., by FIG. 3.

Figure 4B:
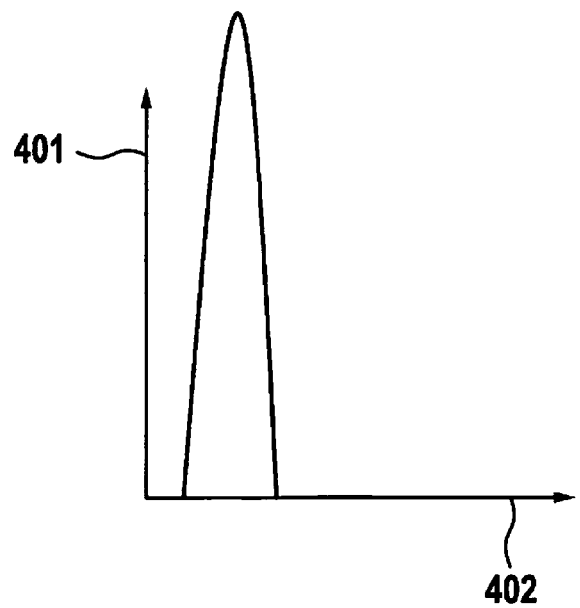
FIG. 4B shows the emitted laser radiation of a transmitter unit, with temporal correlation.

FIG. 4B also shows a graph, in which optical power 401 is plotted versus time 402. Individual pulses 209-*x* of emitters 201-*x* of a transmitter unit 100-1 are represented qualitatively with temporal correlation/synchronization, as shown, e.g., by FIG. 3. The synchronicity of laser pulses 209-*x* is clearly increased in comparison with FIG. 4A.

Alternatively, detector 303 of transmitter unit 100-1B may be an individual monitoring diode. Using a computer program product having program code, the switching times of individual emitters 201-*x* may be adapted for optimization.

In addition, it is possible to control emitters 201-*x* of semiconductor laser 102 of a transmitter unit 100-1 individually. For example, individual emitters 201-*x* may be switched off selectively. This may be advantageous, when highly reflective objects interfering with the measurement are situated in the measuring path.

FIG. 5 shows the cross section of an emitter 201 of a semiconductor laser 102, as a transmitter unit 100-1 shown in the previous figures may have. Emitter 201 includes first section 202, to which first supply variable 204 may be applied. Emitter 201 further includes second section 203, to which second supply variable 205 may be applied. Emitter 201 is able to emit laser pulses 209.

First section 202 includes a first region 502 having at least one semiconductive material. Second section 203 includes a second region 503 having at least one semiconductive material. First region 502 and second region 503 are set apart from each other. In the example, an insulating region 501 is between first region 502 and second region 503. First region 502 and second region 503 are situated on layers, which first section 202 and the second section may share together. First region 502 and second region 503 may be situated on a common waveguide layer 504. Active zone 505 may be situated in the center of waveguide layer 504. First section 202 and second section 203 may also share a common substrate 506.

What is claimed is:

1. A transmitter unit for emitting radiation into a surrounding area, comprising:
    at least one semiconductor laser which includes a plurality of emitters, each emitter having a first section and a second section; and
    at least one control unit configured to control the semiconductor laser;
    wherein the control unit is configured to apply at least one first supply variable to the first sections of the plurality of emitters, and to apply a plurality of second supply variables, differing from the at least one first supply variable, to the second sections of the plurality of emitters, wherein the plurality of second supply variables supplied to the second sections of the plurality of emitters are different from each other to synchronize in time a plurality of laser pulses emitted by the plurality of emitters.

2. The transmitter unit as recited in claim 1, wherein the first section includes a first region having at least one semiconductive material, the second section includes a second region having at least one semiconductive material, and the first region and the second region are set apart from each other.

3. The transmitter unit as recited in claim 1, wherein the transmitter unit further includes a detector configured to detect at least one reference beam emitted by the plurality of emitters, wherein the plurality of second supply variables applied to the plurality of second sections of the plurality of emitters are a function of the at least one reference beam.

4. The transmitter unit as recited in claim 1, wherein the transmitter unit includes further optical elements, the further optical elements include a deflection unit configured to deflect radiation emitted by the semiconductor laser, along a deflecting direction, into the surrounding area.

5. A lidar sensor, comprising:
- a transmitter unit for emitting radiation into a surrounding area, the transmitter unit including:
  - at least one semiconductor laser which includes a plurality of emitters, each emitter having a first section and a second section; and
  - at least one control unit configured to control the semiconductor laser;
  - wherein the control unit is configured to apply at least one first supply variable to the first sections of the plurality of emitters, and to apply a plurality of second supply variables, differing from the at least one first supply variable, to the second sections of the plurality of emitters, wherein the plurality of second supply variables supplied to the second sections of the plurality of emitters are different from each other to synchronize in time a plurality of laser pulses emitted by the plurality of emitters; and
- a receiving unit configured to receive radiation, which has been reflected by an object in the surrounding area.

6. A method of controlling a transmitter unit for emitting radiation into a surrounding area, the transmitter unit including at least one semiconductor laser which has a plurality of emitters, each emitter possessing a first section and a second section, the method comprising the following steps:
- applying at least one first supply variable to the first sections of the plurality of emitters using a control unit; and
- applying a plurality of second supply variables differing from the at least one first supply variable, to the second sections of the plurality of emitters, using the control unit, wherein the plurality of second supply variables supplied to the second sections of the plurality of emitters are different from each other to synchronize in time a plurality of laser pulses emitted by the plurality of emitters.

7. The method as recited in claim 6, wherein the method further comprises the following steps:
- detecting at least one reference beam emitted from the plurality of emitters using a detector;
- analyzing the at least one reference beam; and
- adapting the plurality of second supply variables applied to the plurality of second sections of the plurality of emitters as a function of the analysis.

8. The lidar sensor as recited in claim 5, wherein the transmitter unit further includes a detector configured to detect at least one reference beam emitted by the plurality of emitters, wherein the plurality of second supply variables applied to the second sections of the plurality of emitters are a function of the at least one reference beam.

* * * * *